United States Patent
Miwatashi

(10) Patent No.: US 9,117,897 B2
(45) Date of Patent: Aug. 25, 2015

(54) MOS DEVICE HAVING SHALOW TRENCH ISOLATIONS (STI) WITH DIFFERENT TAPERED PORTIONS

(71) Applicant: Renesas Electronics Corporation, Kawasaki-shi, Kanagawa (JP)

(72) Inventor: Tadahiro Miwatashi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 14/534,865

(22) Filed: Nov. 6, 2014

(65) Prior Publication Data

US 2015/0061022 A1  Mar. 5, 2015

Related U.S. Application Data

(62) Division of application No. 13/617,888, filed on Sep. 14, 2012, now Pat. No. 8,907,423.

(30) Foreign Application Priority Data

Oct. 11, 2011  (JP) ................. 2011-223554

(51) Int. Cl.
| | |
|---|---|
| H01L 27/12 | (2006.01) |
| H01L 21/70 | (2006.01) |
| H01L 21/336 | (2006.01) |
| H01L 29/78 | (2006.01) |
| H01L 21/762 | (2006.01) |

(52) U.S. Cl.
CPC .......... *H01L 29/78* (2013.01); *H01L 21/76232* (2013.01); *H01L 29/7833* (2013.01)

(58) Field of Classification Search
CPC ..................... H01L 29/76232; H01L 29/7833; H01L 29/78

USPC .......... 257/347, E21.561, E29.255, 506, 510; 438/197, 202, 207, 217, 228, 241, 404, 438/407, 225, 501, 294, 745

See application file for complete search history.

(56) References Cited

U.S. PATENT DOCUMENTS

| | | |
|---|---|---|
| 5,933,731 A | 8/1999 | Tanimoto et al. |
| 6,380,020 B1 | 4/2002 | Shimizu |
| 6,713,333 B2 | 3/2004 | Mayuzumi |

(Continued)

FOREIGN PATENT DOCUMENTS

| | | |
|---|---|---|
| JP | 11-150180 A | 6/1999 |
| JP | 2003-133549 A | 5/2003 |
| JP | 2006-253499 A | 9/2006 |

*Primary Examiner* — Long K Tran
*Assistant Examiner* — Dzung Tran
(74) *Attorney, Agent, or Firm* — Foley & Lardner LLP

(57) ABSTRACT

A high withstand voltage transistor is formed in a high withstand voltage region, and a low withstand voltage transistor is formed in a low withstand voltage region in a method of manufacturing a semiconductor device. The method includes forming a thermal oxide film and a silicon nitride film over the surface of a silicon substrate; forming an opening to the thermal oxide film and the silicon nitride film in each of the high withstand voltage region and the low withstand voltage region; etching the silicon substrate to form trenches; burying a buried oxide film in each of the trenches; removing the thermal oxide film and the silicon nitride film; and forming a thick gate oxide film and a thin oxide film. The depth of a tapered portion of the trench in the low withstand voltage region is shallower than that in the high withstand voltage region.

6 Claims, 18 Drawing Sheets

(56) References Cited

U.S. PATENT DOCUMENTS

| | | |
|---|---|---|
| 7,432,163 B2 | 10/2008 | Yajima |
| 2002/0074614 A1* | 6/2002 | Furuta et al. ............ 257/506 |
| 2003/0082861 A1 | 5/2003 | Mayuzumi |
| 2003/0228725 A1* | 12/2003 | Tsujikawa et al. ............ 438/197 |
| 2003/0235964 A1* | 12/2003 | Wolstenholme et al. ..... 438/294 |
| 2004/0145020 A1* | 7/2004 | Kang et al. ............ 257/350 |
| 2004/0169250 A1* | 9/2004 | Kobayashi ............ 257/510 |
| 2005/0042812 A1 | 2/2005 | Brazzelli et al. |
| 2006/0019449 A1 | 1/2006 | Wolstenholme et al. |
| 2006/0202273 A1 | 9/2006 | Yajima |
| 2007/0264784 A1 | 11/2007 | Wolstenholme et al. |
| 2009/0102010 A1* | 4/2009 | Ema et al. ............ 257/506 |

* cited by examiner

MOS DEVICE HAVING SHALLOW TRENCH ISOLATIONS (STI) WITH DIFFERENT TAPERED PORTIONS

CROSS-REFERENCE TO RELATED SPECIFICATIONS

This application is a divisional of U.S. application Ser. No. 13/617,888, filed Sep. 14, 2012, which claims benefit of priority from the prior Japanese Application No. 2011-223554, filed on Oct. 11, 2011; the entire contents of all of which are incorporated herein by reference.

BACKGROUND

The present invention relates to a method of manufacturing a semiconductor device and the semiconductor device and particularly to a semiconductor device in which a high withstand voltage MOS transistor and a low withstand voltage MOS transistor are integrated in one identical semiconductor chip, and trench isolation is adopted.

In recent semiconductor devices, a configuration in which a high withstand voltage MOS transistor and a low withstand voltage MOS transistor are disposed in respective regions is sometimes adopted, for example, as in liquid crystal display (LCD) drivers. This configuration enables integration of circuits operating at different power source voltages in one identical semiconductor chip.

A high withstand voltage MOS transistors and a low withstand voltage MOS transistors have to be controlled independently by eliminating electric interference between the devices. In a method of electrically isolating the devices, shallow trench isolation (STI) of forming a trench in a substrate and burying an insulation material therein has been widely used as means for attaining refinement. The trench isolation is disclosed, for example, in Japanese Unexamined Patent Publication No. Hei 11 (1999)-150180.

When the trench isolation is utilized in the device isolation not only for low withstand voltage MOS transistors but also for high withstand voltage MOS transistors, this provides an advantage capable of device isolation at a small isolation width between devices while maintaining high withstanding voltage. Accordingly, a configuration of using the trench isolation in device isolation both for the high withstand voltage MOS transistor and the low withstand voltage MOS transistor has been progressed rapidly in the application to products of using the high withstand voltage CMOS process such as in LCD drivers. For example, Japanese Unexamined Patent Publication No. 2006-253499 discloses a configuration of using trench isolation in device isolation both for the high withstand voltage MOS transistor and low withstand voltage MOS transistor.

FIG. 1A to FIG. 1C, FIG. 2A to FIG. 2C, and FIG. 3A to FIG. 3C show an example of a method of manufacturing a semiconductor device using trench isolation in device isolation both for a high withstand voltage MOS transistor and a low withstand voltage MOS transistor. In each of FIG. 1A to FIG. 1C, FIG. 2A to FIG. 2C, and FIG. 3A to FIG. 3C, the left part of the drawing shows a structure of a high withstand voltage region where a high withstand voltage MOS transistor is formed and the right part of the drawing shows a structure of a low withstand voltage region where a low withstand voltage MOS transistor is formed. A similar manufacturing method is disclosed also in Japanese Unexamined Patent Publication No. 2006-253499.

In the manufacturing method, as shown in FIG. 1A, a thermal oxide film 102 and a silicon nitride film 103 are formed at first over the surface of a silicon substrate 101. Successively, a resist film 104 is formed by photolithography. By using the resist film 104 as a mask, the thermal oxide film 102 and the silicon nitride film 103 are patterned, and successively, the silicon substrate 101 is shallowly dry etched to form a shallow trench 105. The side wall of the shallow trench 105 forms a portion of a trench formed by a process to be described later and is hereinafter referred to as a tapered portion 105a. The tapered portion 105a is formed so as to have a desired taper angle (angle to the surface of the silicon substrate 101). The taper angle of the tapered portion 105a is preferably 45 degree.

Successively, as shown in FIG. 1B, a deposition film 106 is formed over the entire surface including the side wall of the resist film 104, the side wall of the silicon nitride film 103, and the side wall of the thermal oxide film 102. The deposition film 106 is deposited by generating plasmas in a gas mixture comprising a fluorocarbon gas (for example, $C_4F_8$) not containing hydrogen and a CO gas. Further, as shown in FIG. 1C, the silicon substrate 101 is anisotropically etched to form a trench 107. In this case, the deposition film 106 serves as a side wall to protect the tapered portion 105a having a desired taper angle. The taper angle of the main portion 107a of the trench 107 is made steeper than that of the tapered portion 105a (that is, angle formed to the surface of the silicon substrate 101 is larger).

Then, when the resist film 104 and the deposition film 106 are removed, a trench 107 having a shape where the tapered portion 105a at a taper angle of 45 degrees is formed only to the opening edge is obtained. Successively, as shown in FIG. 2A, rounding-off oxidation is performed in the next step to form a thermal oxide film 108. Further, after burying a buried oxide film 109 in the trench 107, polishing is performed using the silicon nitride film 103 as a stopper. Thus, a portion of the buried oxide film 109 is removed and additional etching is performed so that the remaining buried oxide film 109 has a desired height.

Further, as shown in FIG. 2B, a desired trench isolation structure is formed by selectively removing the silicon nitride film 103 and the thermal oxide film 102 therebelow. In this step, an indent referred to as a divot is formed in the buried oxide film 109 used for trench isolation when the thermal oxide film 102 below the silicon nitride film 103 is removed. The divot is shown by reference 110 in FIG. 2B. Formation of the divot is also disclosed, for example, in Japanese Unexamined Patent Publication No. 2003-133549.

Then, as shown in FIG. 2C, a thick gate oxide film 111 is formed by thermal oxidation for forming a high withstand voltage MOS transistor. The thick gate oxide film 111 is formed in both of the high withstand voltage region and the low withstand voltage region.

Further, as shown in FIG. 3A, the thick gate oxide film 111 is removed only in the low withstand voltage region. When the thick gate oxide film 111 is removed, the divot 110 in the low withstand voltage region is further enlarged. In FIG. 3A, the enlarged divot is shown by a reference 110a. Subsequently, as shown in FIG. 3B, a thin gate oxide film 112 for the low withstand voltage MOS transistor is formed.

Successively, as shown in FIG. 3C, a gate electrode is formed over the thick gate oxide film and the thin gate oxide film. Further, by way of steps such as source-drain ion implantation for forming a MOS transistor, a high withstand voltage MOS transistor and a low withstand voltage MOS transistor are formed in the high withstand voltage region and the low withstand voltage region, respectively.

FIG. 4 is a plan view showing a structure of the thus formed high withstand voltage MOS transistor and FIG. 5 is a cross sectional view showing the structure of the high withstand voltage MOS transistor along a cross section I-I' in FIG. 4. As shown in FIG. 4, the gate electrode 113 is formed so as to traverse an active region 114, and a device isolation region 115 is formed so as to surround the active region 114. The thermal oxide film 108 and the buried oxide film 109 are formed in the device isolation region 115.

SUMMARY

However, according to the inventors' study, it is difficult to ensure good characteristics both for the high withstand voltage MOS transistor and the low withstand voltage MOS transistor by the method of manufacturing the semiconductor device shown in FIG. 1A to FIG. 1C, FIG. 2A to FIG. 2C, and FIG. 3A to FIG. 3C. Particularly, optimization for the depth of the tapered portion 105a (that is, the depth of the shallow trench 105) is difficult. The difficulty in the optimization for the depth of the tapered portion 105a is to be described.

With reference to FIG. 5, in the high withstand voltage MOS transistor, a gate electric field is moderated by the taper angle of the tapered portion 105a. On the other hand, an electric field is concentrated to a position where the taper angle changes, that is, also to a joining position between the tapered portion 105a and the main portion 107a. It is necessary to ensure a sufficient distance L between the joined position and the bottom of the divot 110 for ensuring the gate withstanding voltage. That is, the tapered portion 105a has to be formed more deeply than a predetermined depth (for example, about equal with the thickness Tox for the thick gate oxide film 111. In FIG. 5, the depth of the tapered portion 105a is shown by $d_{TAPER}$.

A graph in FIG. 6 shows a result of evaluation for TDDB (time dependent dielectric breakdown) that evaluates the reliability of the gate withstanding voltage of the high withstand voltage MOS transistor whose gate oxide film is 30 nm thick. TDDB is evaluated at three levels of depth $d_{TAPER}$ of the tapered portion 105a (depth of shallow trench 105): 15 nm, 30 nm, and 45 nm. In the graph of FIG. 6, the time at the destruction of the gate oxide film 111 is plotted when a predetermined electric field (−10 mV/cm) is applied in the form of a weibull plot.

When the depth $d_{TAPER}$ of the tapered portion 105a is 15 nm, early destruction occurs in the MOS transistor. In the weibull plot, the destruction time is not plotted on a straight line and this suggests that the destruction portion is not present in the gate oxide film 111 but this is due to the deterioration of the insulation withstand voltage in the oxide film buried in the trench 107 (thermal oxide film 108 and/or buried oxide film 109).

On the other hand, a graph in FIG. 7 shows the result of TDDB evaluation at the film thickness of 45 nm of the gate oxide film 111. A positive result is obtained at the depth $d_{TAPER}$ of the tapered portion 105a of 45 nm; however, in the case of the depth $d_{TAPER}$ of the tapered portion 105a of 30 nm, 15 nm, early destruction sometimes occurs due to the deterioration of the dielectric withstand voltage of the oxide film buried in the trench 107. This is not preferred from a viewpoint of ensuring the device reliability.

The result described above shows that the depth $d_{TAPER}$ of the tapered portion 105a has to be at least 30 nm or more and, depending on the case, 45 nm or more for the high withstand voltage MOS transistor.

On the other hand, as to be described below, for improving the characteristic of the low withstand voltage MOS transistor, it is necessary that the depth $d_{TAPER}$ of the tapered portion 105a is shallow. In the low withstand voltage region, after removing the thick gate oxide film 111 for the high withstand voltage MOS transistor, the thin gate oxide film 112 for the low withstand voltage MOS transistor is formed as described above. In case of removing the thick gate oxide film 111, a portion in the thermal oxide film 108 that is formed at the tapered portion 105a with a small taper angle tends to be removed more easily than the portion formed in the main portion 107a at a large taper angle (steep portion) as can be understood in view of FIG. 8A. Therefore, the silicon substrate 101 is exposed at the tapered portion 105a situated near the opening of the trench 107. Successively, when the thin gate oxide film 112 is formed and a gate electrode 113 is formed over the thin gate oxide film 112, a low withstand voltage MOS transistor in which the tapered portion 105a is covered with the thin gate oxide film 112 is formed.

In the low withstand voltage MOS transistor formed as described above, a sub-channel 116 is formed to the surface of the silicon substrate 101 at a portion situated to the tapered portion 105a. If the sub-channel 116 is formed, this results a problem that a hump characteristic is generated in a drain current-gate voltage characteristic (Id-Vg characteristic). FIG. 9 shows an example of the Id-Vg characteristic of the low withstand voltage MOS transistor fabricated by the manufacturing method described above in which a broken line represents an Id-Vg characteristic for the depth of the tapered portion 105a of 30 nm and a solid line represents an Id-Vg characteristic for the depth of 45 nm. For preventing the formation of the sub-channel 116, it is necessary to make the tapered portion 105a with a moderate taper angle shallow (as much as possible). In view of the result of actual experiment, the depth of the tapered portion 105a has to be about 30 nm or less in order to eliminate the effect to the Id-Vg characteristic caused by the formation of the sub-channel 116.

The result described above means that the depth $d_{TAPER}$ of the tapered portion 105a has to be set at least to 30 nm or more from the viewpoint of the TDDB characteristic of the high withstand voltage MOS transistor, and on the other hand, the depth $d_{TAPER}$ of the tapered portion 105a has to be set to about 30 nm or less from the viewpoint of the hump characteristic of the low withstand voltage MOS transistor. As described above, even when the depth $d_{TAPER}$ of the tapered portion 105a is optimized, it is difficult to obtain a satisfactory characteristic both for the high withstand voltage MOS transistor and the low withstand voltage MOS transistor in the manufacturing method described above.

Accordingly, the present invention intends to provide a technique for obtaining a satisfactory characteristic both for the high withstand voltage MOS transistor and the low withstand voltage MOS transistor.

According to one aspect of the invention, there is provided a method of manufacturing a semiconductor device in which a first transistor having a first gate oxide film is formed in a first layer and a second transistor having a second gate oxide film thinner than the first gate oxide film is formed in a second region.

The method of manufacturing the semiconductor device includes: forming a protective film including a protective oxide film in contact with the surface of a silicon substrate on the surface of the silicon substrate; providing a first opening to the protective film in the first region and providing a second opening to the protective film in the second region; etching the silicon substrate thereby forming a first trench and a second trench in communication with the first opening and the second opening, respectively; burying a buried oxide film in the first trench and in the second trench; removing the protective film; forming a first gate oxide film to a portion in the first region from which the protective film has been removed; and forming a second gate oxide film to a portion in the second region from which the protective film has been removed.

The first trench has a first tapered portion extended from the surface of the silicon substrate and having a taper and a first trench main portion extended from the bottom of the first tapered portion and having a taper steeper than the first tapered portion. The second trench has a second tapered portion extended from the surface of the silicon substrate and having a taper and a second trench main portion extended from the bottom of the second tapered portion and having a taper steeper than the second tapered portion. The depth at a position where the second tapered portion and the second trench main portion are in contact to each other is shallower than the depth at the position where the first tapered portion and the first trench main portion are in contact to each other.

According to another aspect of the present invention, there is provides a semiconductor device which includes a silicon substrate; a first trench formed in a first region of the silicon substrate; a first buried oxide film for burying the first trench; a second trench formed in a second region of the second substrate; a second buried oxide film for burying the second trench; a first gate oxide film situated adjacent to the first trench in the first region and formed to the surface of the silicon substrate; a second gate oxide film situated adjacent to the second trench in the second region and formed to the surface of the silicon substrate; a first gate electrode formed over the first gate oxide film; and a second gate electrode formed over the second gate oxide film.

The thickness of the second gate oxide film is thinner than the thickness of the first gate oxide film. The first trench has a first tapered portion extended from the surface of the silicon substrate and having a taper and a first trench main portion extended from the bottom of the first tapered portion and having a taper steeper than the first tapered portion.

The second trench has a second tapered portion extended from the surface of the silicon substrate and having a taper and a second trench main portion extended from the bottom of the second tapered portion and having a taper steeper than the second tapered portion.

The depth at a position where the second tapered portion and the second trench main portion are in contact to each other is shallower than the depth at a position where the first tapered portion and the first trench main portion are in contact to each other.

The present invention can provide a technique for obtaining a satisfactory characteristic both for the high withstand voltage MOS transistor and the low withstand voltage MOS transistor.

DETAILED DESCRIPTION

First Embodiment

FIG. 10A to FIG. 10C, FIG. 11A to FIG. 11C, and FIG. 12 are cross sectional views showing a method of manufacturing a semiconductor device according to a first embodiment of the invention. As illustrated, for example, in FIG. 11C, one of the features of the semiconductor device of this embodiment is that a tapered portion 5a near the upper end of a trench 11 formed in a high withstand voltage region (region where a high withstand voltage MOS transistor is formed) is formed relatively deeply, whereas a tapered portion 8a near the upper end of a trench 12 formed in a low voltage region (region where a low withstand voltage MOS transistor is formed) is formed relatively shallowly. This increases the thickness of an oxide film at the bottom of a divot in the high withstand voltage MOS transistor and, at the same time, suppresses the formation of a sub-channel in the low withstand voltage MOS transistor. The semiconductor device according to the first embodiment and the manufacturing method thereof are to be described specifically.

Figure 1A:
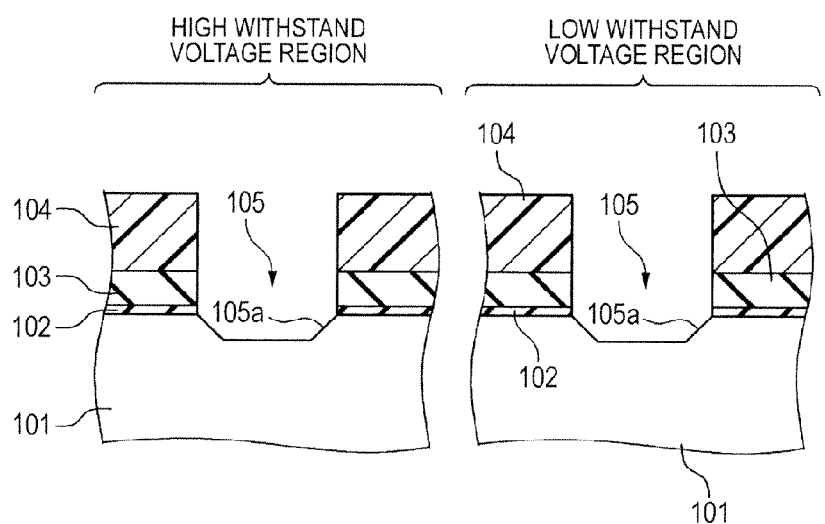
FIG. 1A is a cross sectional view showing an example of a method of manufacturing a semiconductor device having a high withstand voltage MOS transistor and a low withstand voltage MOS transistor.
Figure 1B:
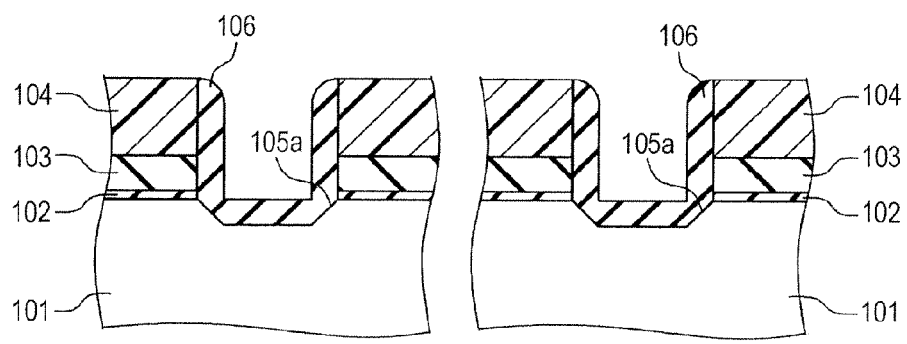
FIG. 1B is a cross sectional view showing the example of the method of manufacturing the semiconductor device having the high withstand voltage MOS transistor and the low withstand voltage MOS transistor.
Figure 1C:
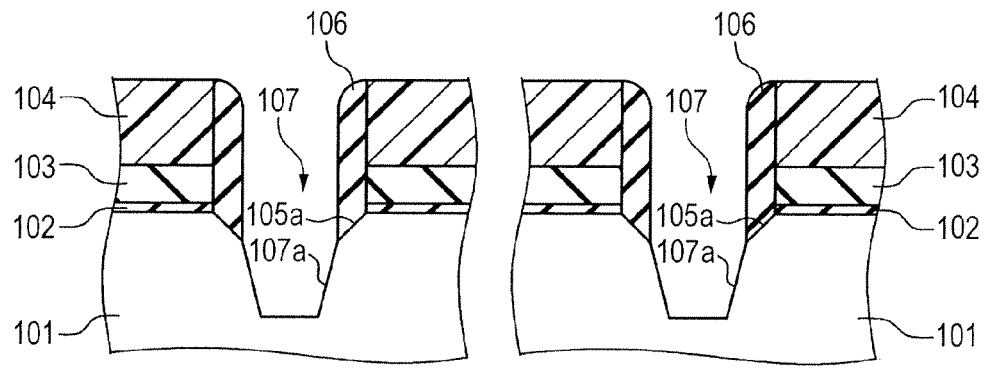
FIG. 1C is a cross sectional view showing the example of the method of manufacturing the semiconductor device having the high withstand voltage MOS transistor and the low withstand voltage MOS transistor.
Figure 2A:
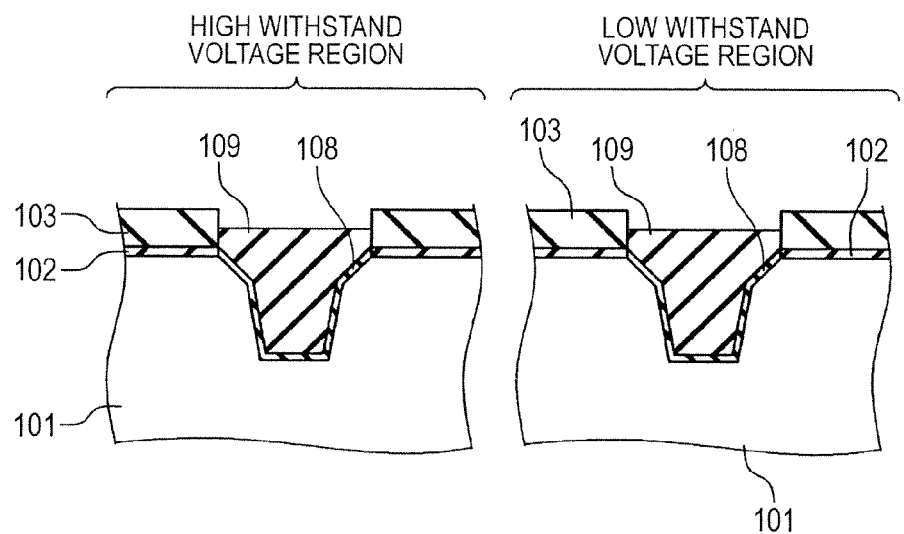
FIG. 2A is a cross sectional view showing the example of the method of manufacturing the semiconductor device having the high withstand voltage MOS transistor and the low withstand voltage MOS transistor.
Figure 2B:
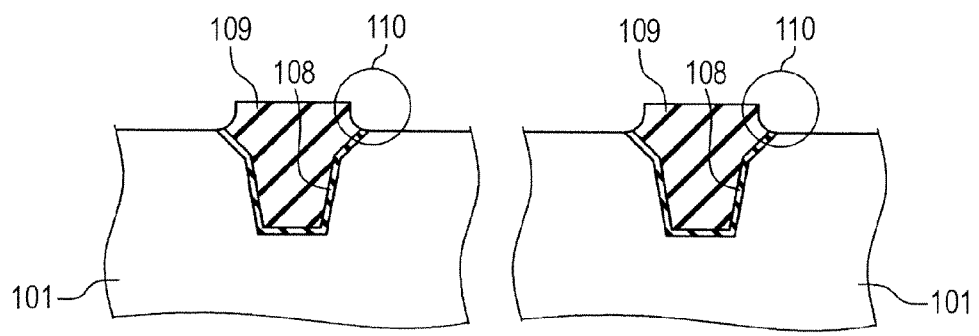
FIG. 2B is a cross sectional view showing the example of the method of manufacturing the semiconductor device having the high withstand voltage MOS transistor and the low withstand voltage MOS transistor.
Figure 2C:
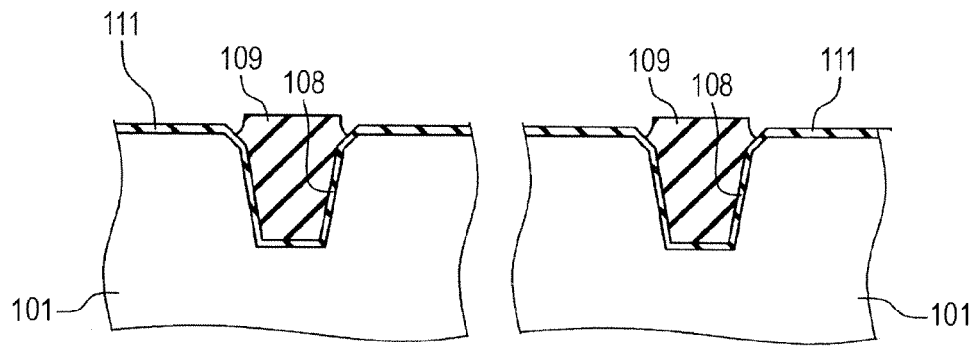
FIG. 2C is a cross sectional view showing the example of the method of manufacturing the semiconductor device having the high withstand voltage MOS transistor and the low withstand voltage MOS transistor.
Figure 3A:
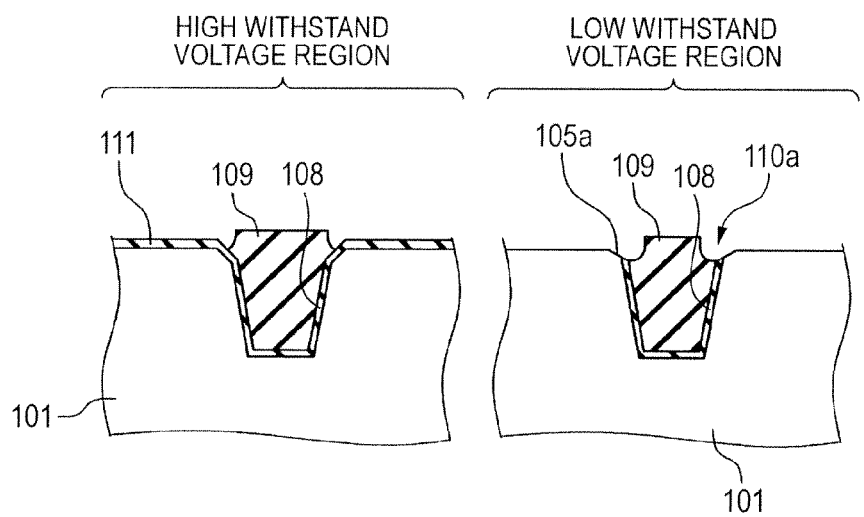
FIG. 3A is a cross sectional view showing the example of the method of manufacturing the semiconductor device having the high withstand voltage MOS transistor and the low withstand voltage MOS transistor.
Figure 3B:
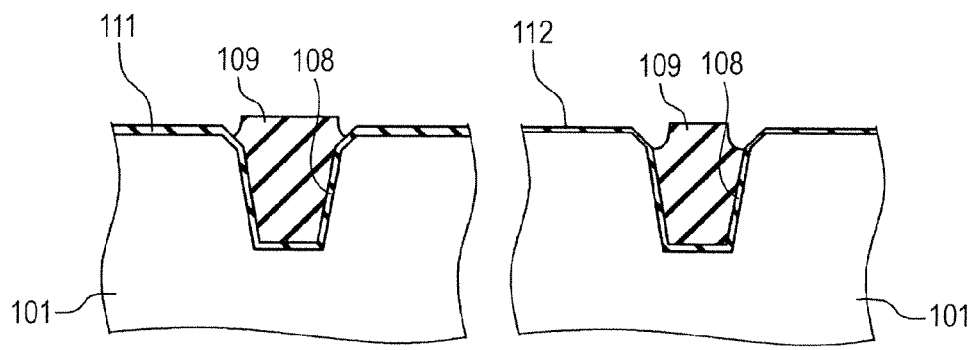
FIG. 3B is a cross sectional view showing the example of the method of manufacturing the semiconductor device having the high withstand voltage MOS transistor and the low withstand voltage MOS transistor.
Figure 3C:
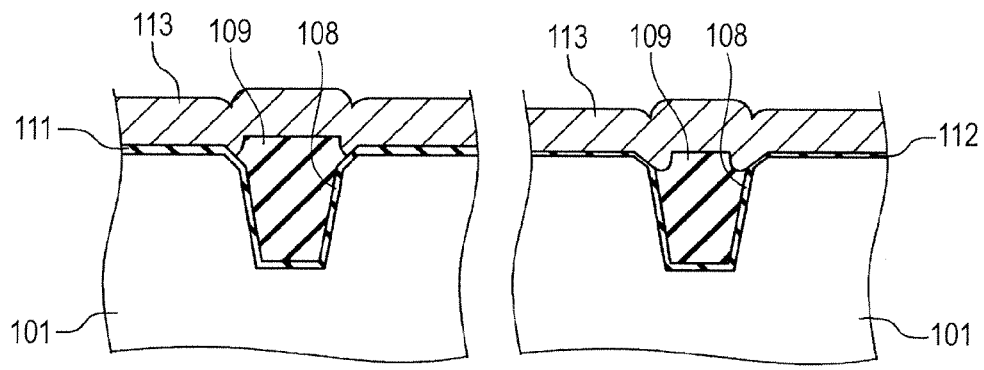
FIG. 3C is a cross sectional view showing the example of the method of manufacturing the semiconductor device having a high withstand voltage MOS transistor and the low withstand voltage MOS transistor.
Figure 4:
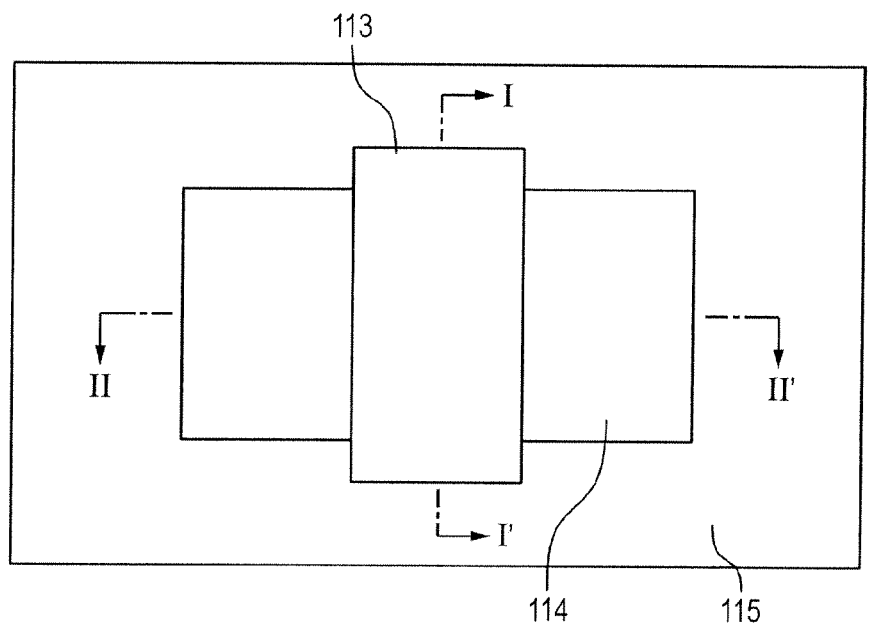
FIG. 4 is a plan view showing a structure of the high withstand voltage MOS transistor.
Figure 5:
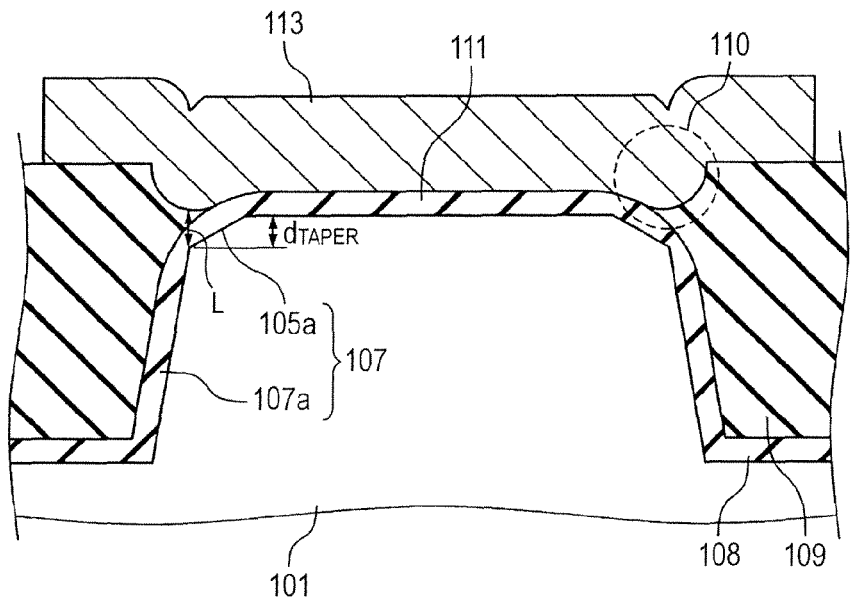
FIG. 5 is a cross sectional view showing the structure of the high withstand voltage MOS transistor.
Figure 6:
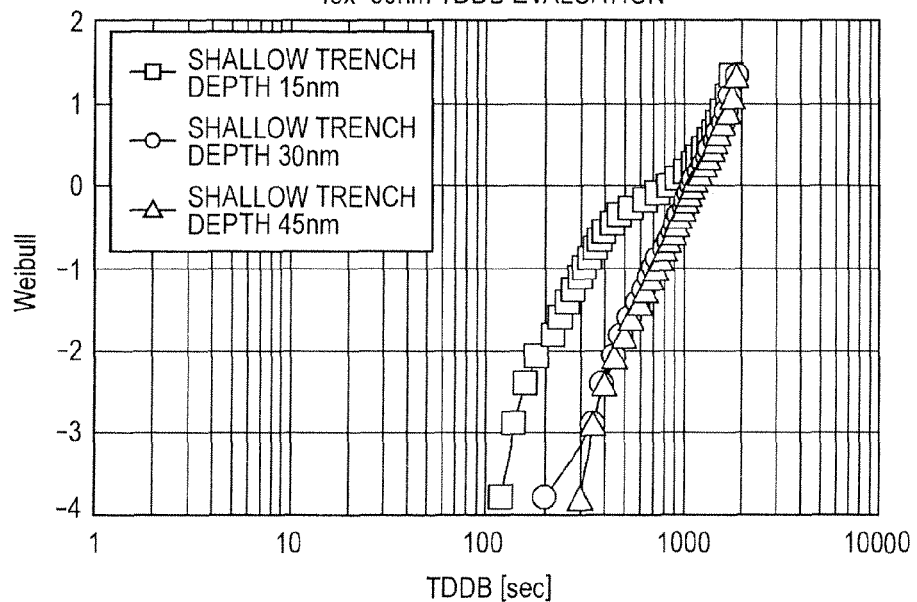
FIG. 6 is a graph showing the result of TDDB evaluation for a high withstand voltage MOS transistor in which the depth of a shallow trench (tapered portion) is 15 nm, 30 nm, and 45 nm, and the thickness of the oxide film is 30 nm.
Figure 7:
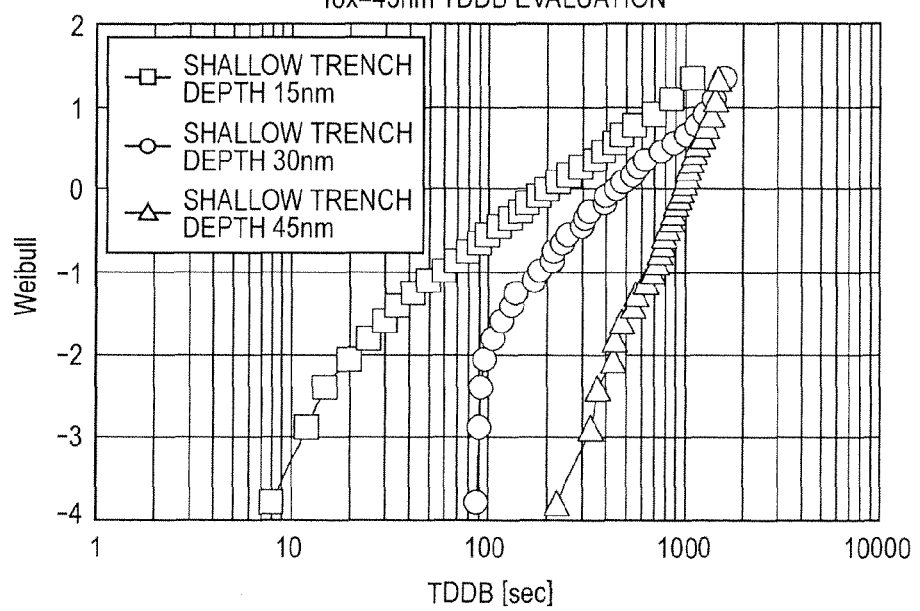
FIG. 7 is a graph showing the result of TDDB evaluation of the high withstand voltage MOS transistor in which the depth of the shallow trench (tapered portion) is 15 nm, 30 nm, and 45 nm, and the thickness of the oxide film is 45 nm.
Figure 8A:
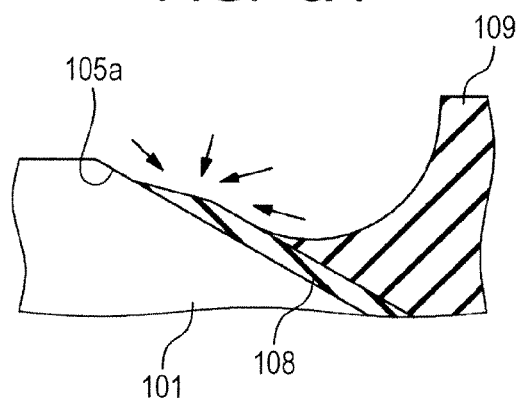
FIG. 8A is a cross sectional view showing a structure of a tapered portion of a trench of a low withstand voltage MOS transistor.
Figure 8B:
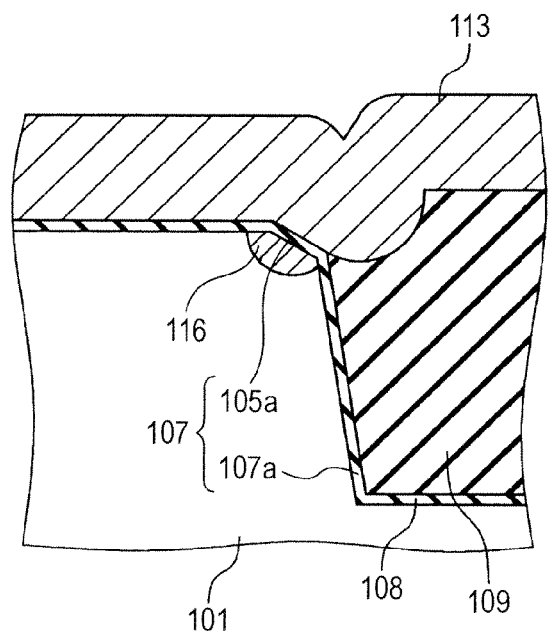
FIG. 8B is a cross sectional view showing a sub-channel formed to the tapered portion of the low withstand voltage MOS transistor.
Figure 9:
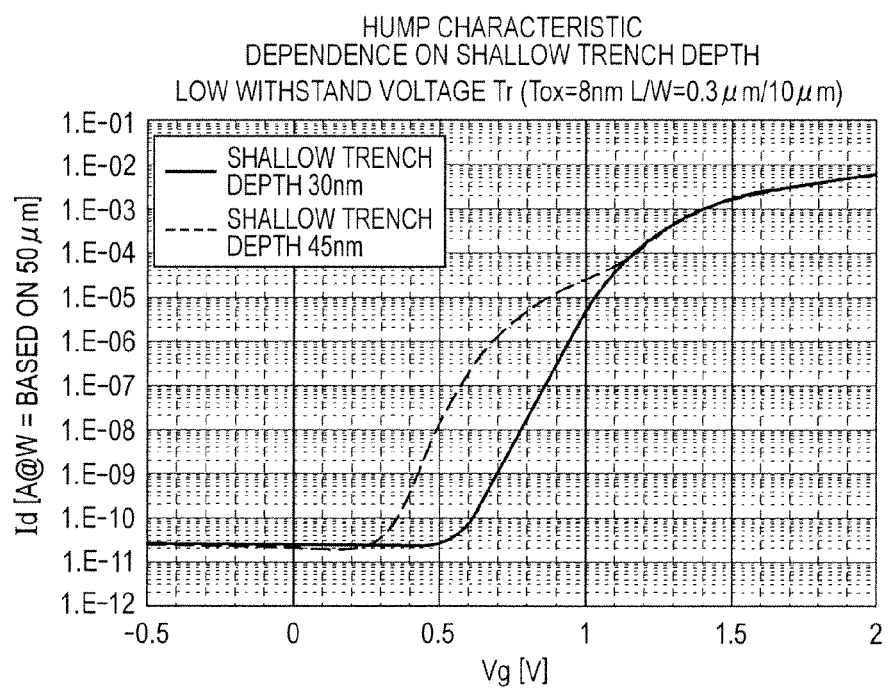
FIG. 9 is a graph showing an Id-Vg curve showing a hump characteristic of a low withstand voltage MOS transistor in which the depth of a shallow trench (tapered portion) is 30 nm and 45 nm and the thickness of the gate oxide film is 8 nm.
Figure 10A:
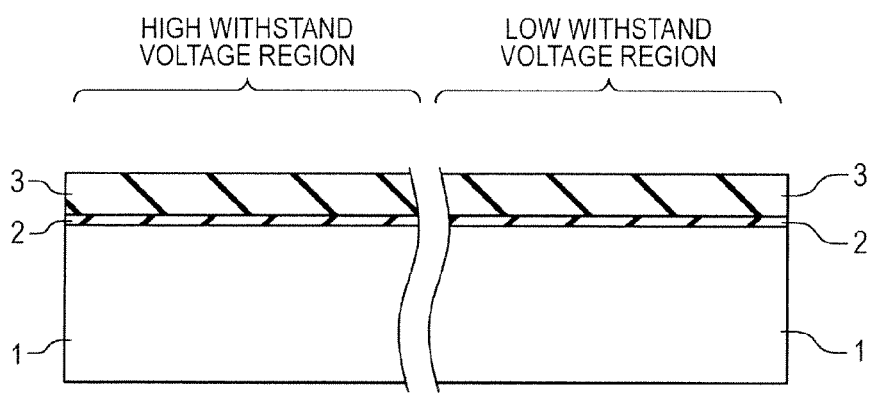
FIG. 10A is a cross sectional view showing a method of manufacturing a semiconductor device according to a first embodiment of the invention.

With reference to FIG. 10A, a thermal oxide film 2 of about 10 nm thickness is at first formed to the surface of a single crystal silicon substrate 1 by thermal oxidation at about 850° C. A silicon nitride film 3 of about 160 nm thickness is deposited over the thermal oxide film 2 by a CVD (Chemical Vapor Deposition) method. The thermal oxide film 2 and the silicon nitride film 3 function as protective films for protecting the silicon substrate 1.

Figure 10B:
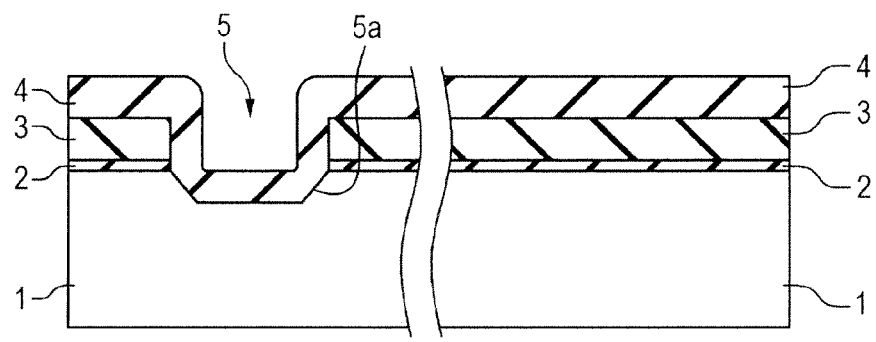
FIG. 10B is a cross sectional view showing the method of manufacturing the semiconductor device according to the first embodiment of the invention.

Successively, as shown in FIG. 10B, the thermal oxide film 2 and the silicon nitride film 3 are removed at a predetermined portion in a high withstand voltage region by dry etching using a photoresist as a mask (not illustrated) to form an opening for exposing a portion of the silicon substrate 1. Further, a shallow trench 5 is formed to a depth of 45 nm by shallowly dry etching the portion exposed through the opening of the silicon substrate 1. The shallow trench 5 is formed such that the taper angle of the side wall (angle formed between the surface of the silicon substrate and the horizontal surface) is preferably 45°. The side wall of the shallow trench 5 forms a tapered portion formed near the upper end of the trench prepared in the high withstand voltage region in the succeeding step which is to be illustrated by a reference 5a. Further, after removing the photoresist, an oxide film 4 is grown at a thickness of 70 nm over the entire surface by a CVD method.

Figure 10C:
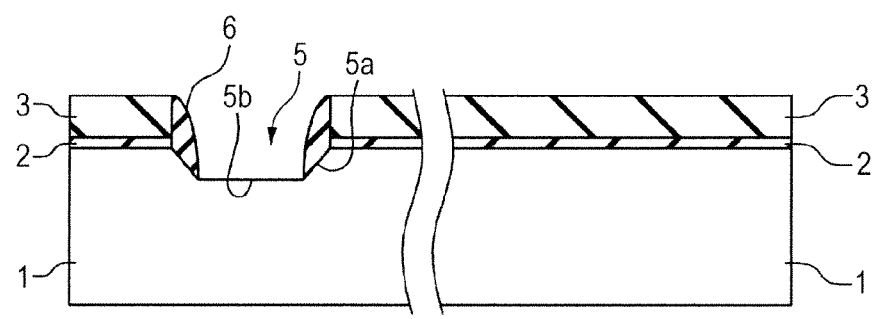
FIG. 10C is a cross sectional view showing the method of manufacturing the semiconductor device according to the first embodiment of the invention.

Then, as shown in FIG. 10C, the oxide film 4 is etched back till the silicon substrate 1 is exposed at the bottom 5b of the shallow trench 5. With the steps described above, the shallow trench 5 and a side wall 6 are formed only in the high voltage transistor forming region.

Figure 11A:
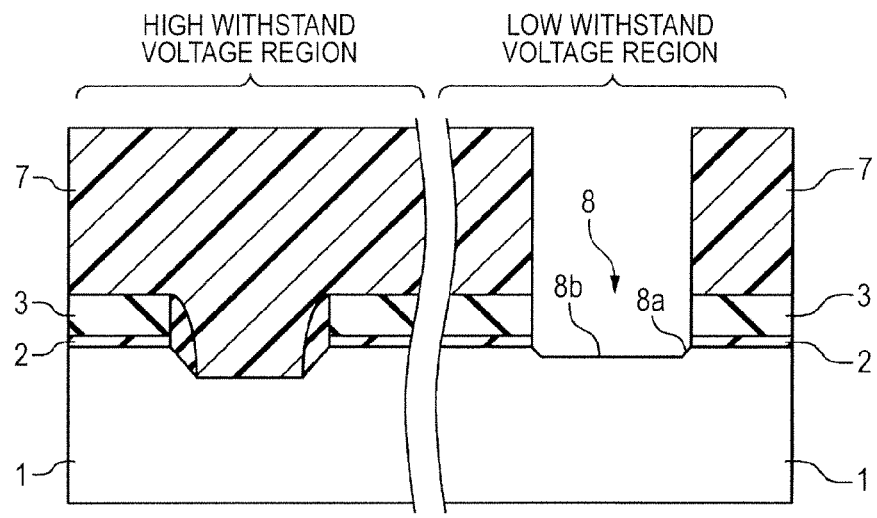
FIG. 11A is a cross sectional view showing the method of manufacturing the semiconductor device according to the first embodiment of the invention.

Successively, as shown in FIG. 11A, a desired region in the low withstand voltage region is patterned in a state where the high withstand voltage region is covered with a resist film 7 to form an opening for exposing a portion of the silicon substrate 1. Further, a portion exposed by the opening of the silicon substrate 1 is dry etched shallowly to form a shallow trench 8 of 30 nm depth selectively only in the low withstand voltage region. The side wall of the shallow trench 8 forms a tapered portion formed near the upper end of the trench fabricated in the low withstand voltage region in the subsequent step, which is to be illustrated by a reference 8a.

Figure 11B:
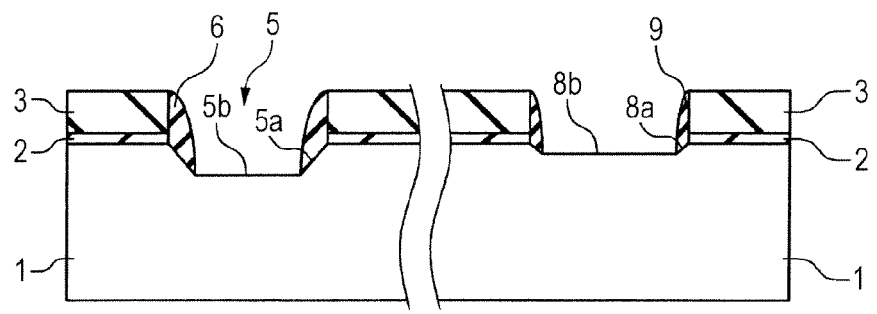
FIG. 11B is a cross sectional view showing the method of manufacturing the semiconductor device according to the first embodiment of the invention.

Successively, as shown in FIG. 11B, after removing the resist film 7, an oxide film of 30 nm thickness is grown over the entire surface by a CVD method and, further, the oxide film is etched back by dry etching till the silicon substrate 1 is exposed at the bottom 8b of the shallow trench 8. With the steps described above, the side wall 9 is formed only in the low withstand voltage region.

Figure 11C:
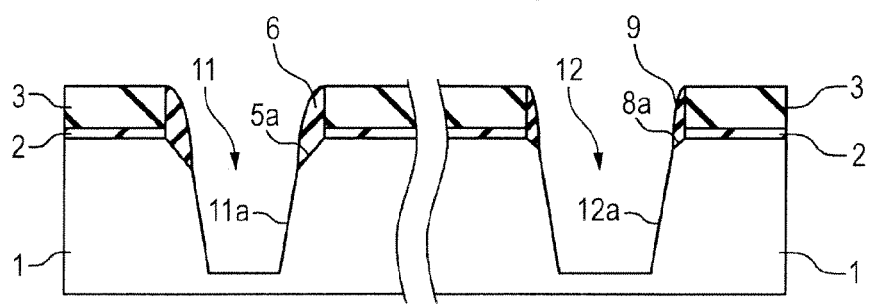
FIG. 11C is a cross sectional view showing the method of manufacturing the semiconductor device according to the first embodiment of the invention.

Then, as shown in FIG. 11C, a portion where the silicon substrate 1 is exposed is anisotropically etched, and a trench 11 is formed in the high withstand voltage region while a trench 12 is formed in the low withstand voltage region. Respective taper angles of the main portion 11a of the trench 11 and the main portion 12a of the trench 12 are steeper than those of the tapered portions 5a and 8a (that is, angle formed relative to the surface of the silicon substrate 1 is large). The depth of the main portion 11a of the trench 11 and the depth of the main portion 12a of the trench 12 is 800 nm in one embodiment.

Figure 12:
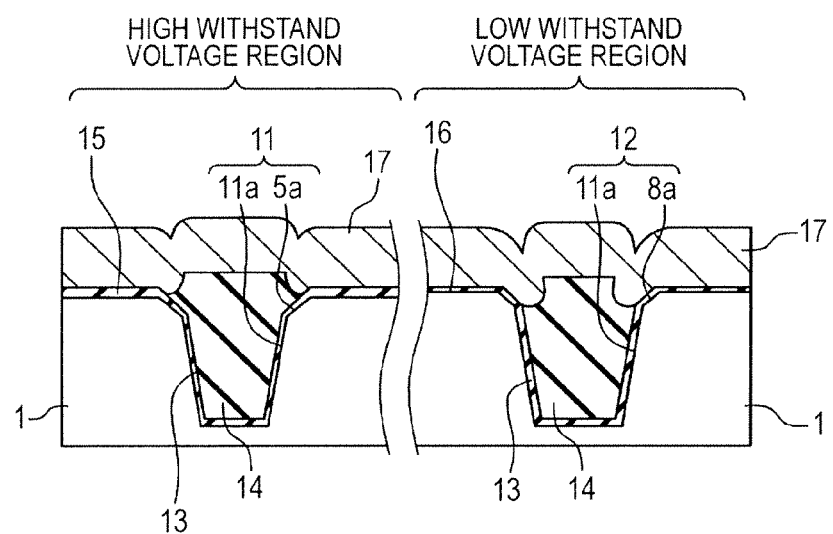
FIG. 12 is a cross sectional view showing the method of manufacturing the semiconductor device according to the first embodiment of the invention.

Further with reference to FIG. 12, after forming the trenches 11, 12 by the method as described above, the side walls 6 and 9 are removed by wet etching. Successively, a thermal oxide film 13 of 20 nm thickness is formed in the trenches 11 and 12 by rounding-off oxidation and, further, a buried oxide film 14 is buried in the trenches 11 and 12. Successively, after polishing treatment using the silicon nitride film 3 as a stopper, an additional etching is performed such that the buried oxide film 14 has a desired height. Then, after removing the silicon nitride film 3 and the thermal oxide film 2 therebelow, a thick gate oxide film 15 of 45 nm thickness for forming the high withstand voltage MOS transistor is formed in the high withstand voltage region.

Then, after removing the thick gate oxide film 15 only from the low withstand voltage region, a thin gate oxide film 16 of 8 nm thickness for the low withstand voltage MOS transistor is formed. Then, a gate electrode 17 is formed over the thick gate oxide film 15 and the thin gate oxide film 16.

Further, by way of steps performed for forming the MOS transistor such as ion implantation to source/drain regions, etc., a high withstand voltage MOS transistor and a low withstand voltage MOS transistor are formed in the high withstand voltage region and the low withstand voltage region respectively.

Figure 13:
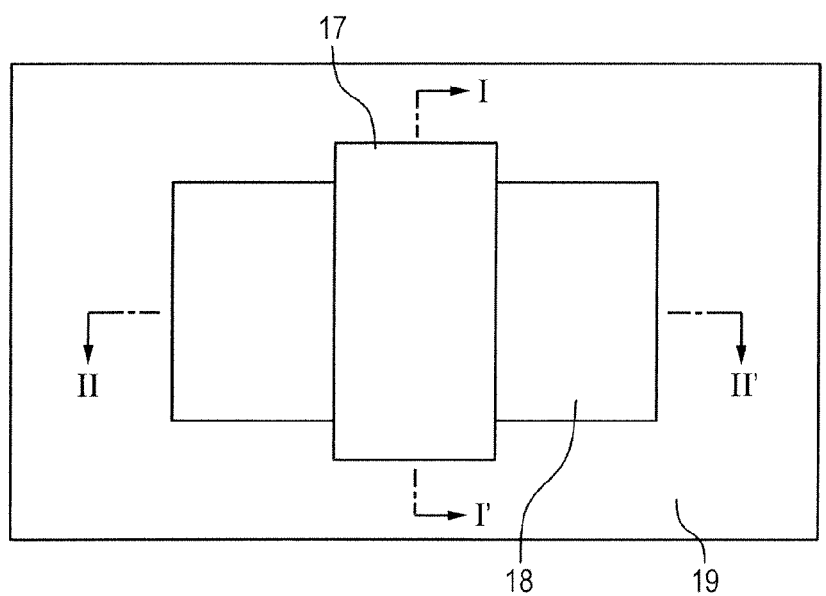
FIG. 13 is a plan view showing a structure of a high withstand voltage MOS transistor in the first embodiment.
Figure 14:
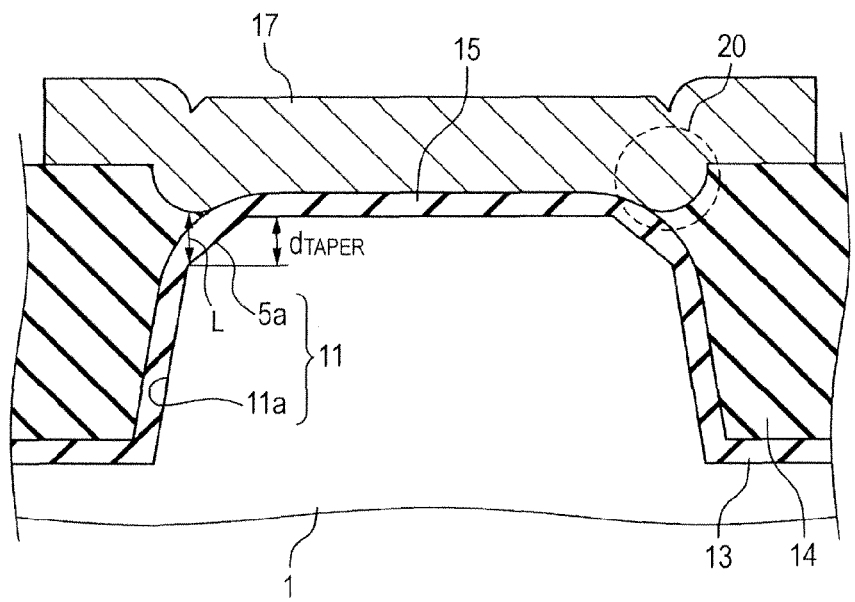
FIG. 14 is a cross sectional view showing a structure of a high withstand voltage MOS transistor along a cross section I-I' in FIG. 13.
Figure 15:
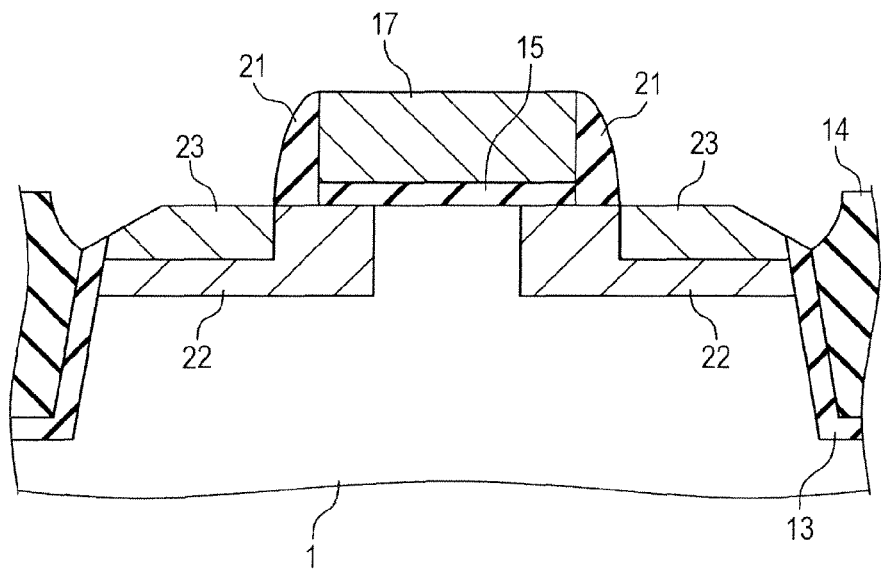
FIG. 15 is a cross sectional view showing the structure of the high withstand voltage MOS transistor along a cross section II-II' in FIG. 13.

FIG. 13 is a plan view showing a structure of a high withstand voltage MOS transistor fabricated by the method of manufacturing the semiconductor device of this embodiment, FIG. 14 is a cross sectional view showing a structure of the high withstand voltage MOS transistor along a cross section I-I' in FIG. 13, and FIG. 15 is a cross sectional view showing a structure of the high withstand voltage MOS transistor along a cross section II-II' in FIG. 13. As shown in FIG. 13, a gate electrode 17 is formed so as to traverse an actual region 18 and a device isolation region 19 is formed so as to surround the active region 18. The thermal oxide film 13 and the buried oxide film 14 are formed in the device isolation region 19.

As shown in FIG. 15 along a cross section the high withstand voltage MOS transistor fabricated by the manufacturing method of this embodiment has the same structure as a usual high withstand voltage MOS transistor adopting trench isolation. In the active region 18, double diffused drains (DDD) 22 are formed and source/drain regions 23 are formed. A thick gate oxide film 15 is formed so as to cover the channel region (a portion of the surface of the silicon substrate between DDDs 22), and a gate electrode 17 is formed over the gate oxide film 15.

On the other hand, as shown in FIG. 14 along a cross section I-I', the high withstand voltage MOS transistor fabricated by the manufacturing method of this embodiment is formed so as to have a high withstand voltage as to be described later. According to the manufacturing method of this embodiment, a divot 20 is formed at the corner of the buried oxide film 14. The divot 20 is formed such that the distance L between the joined position of the tapered portion 5a and the main portion 11a, and the bottom of the divot 20 is larger than the thickness Tox of the gate oxide film 15. Thus, a high withstand voltage MOS transistor having a high withstand voltage can be formed.

For attaining such a structure, it is preferred to select the thickness of the gate oxide film 15 to 30 nm to 50 nm and the depth $d_{TAPER}$ of the tapered portion 5a to 45 nm to 65 nm. By selecting the thickness of the gate oxide film 15 and the depth $d_{TAPER}$ of the tapered portion 5a of the gate oxide film 15 as described above, the distance L between the bottom of the divot 20 and the silicon substrate 1 can be made larger than the thickness Tox of the gate oxide film 15.

Figure 16:
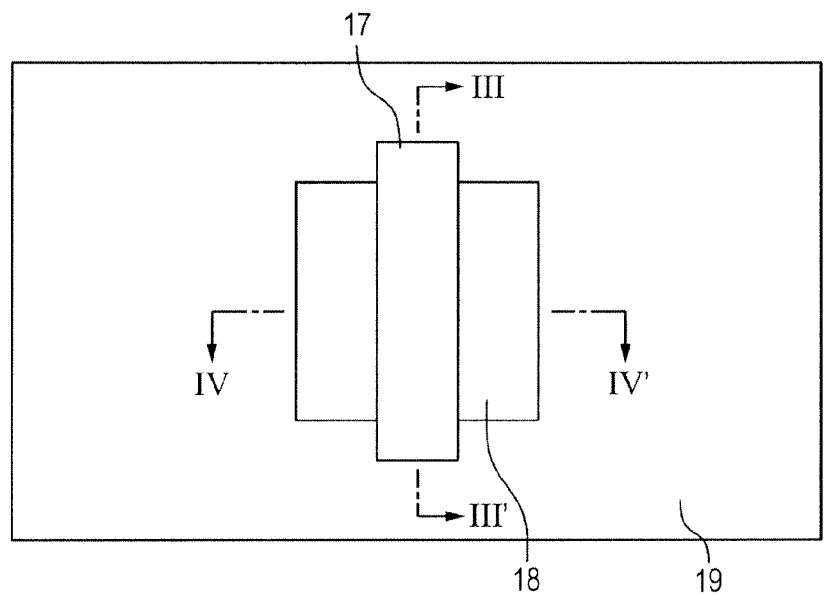
FIG. 16 is a plan view showing a structure of the low withstand voltage MOS transistor in the first embodiment.
Figure 17:
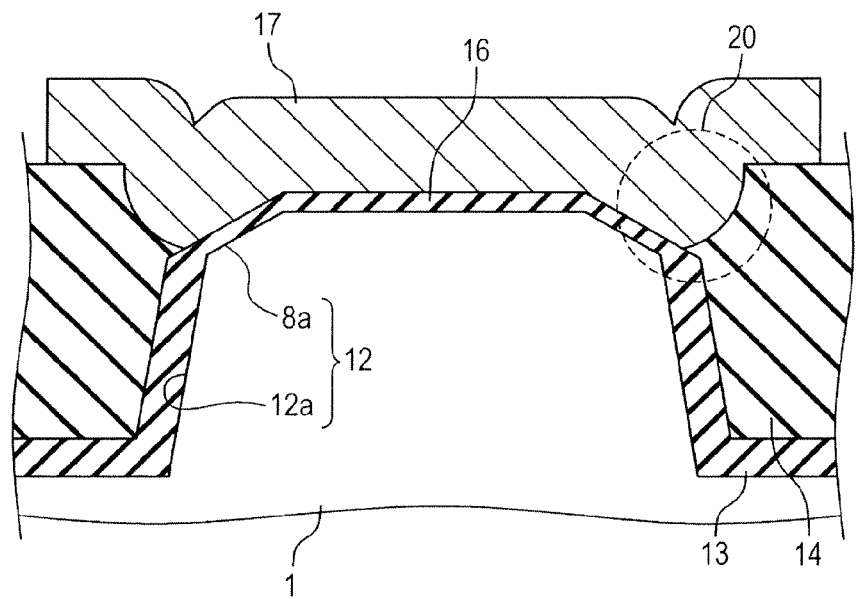
FIG. 17 is a cross sectional view showing a structure of a low withstand voltage MOS transistor along a cross section III-III' in FIG. 16.
Figure 18:
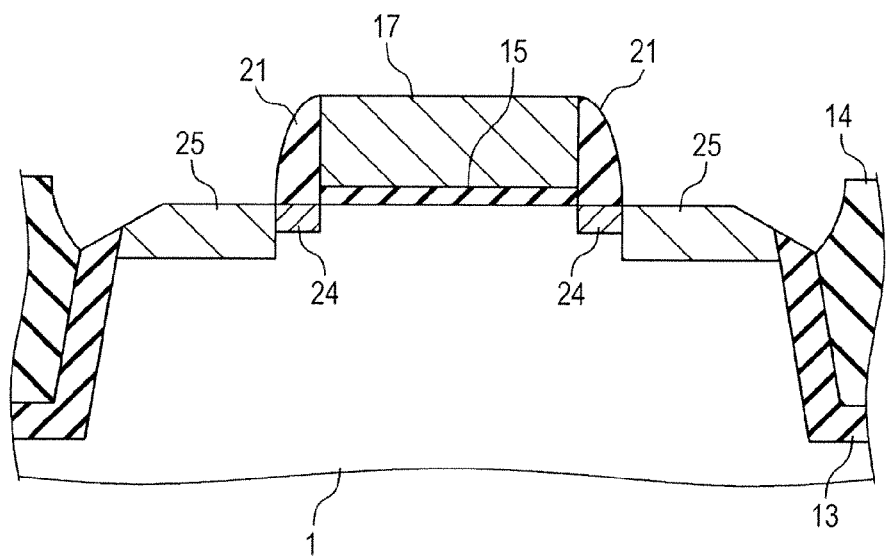
FIG. 18 is a cross sectional view showing a structure of a low withstand voltage MOS transistor along a cross section IV-IV' in FIG. 16.

FIG. 16 is a plan view showing a structure of a low withstand voltage MOS transistor, FIG. 17 is a cross sectional view showing a structure of a low withstand voltage MOS transistor along a cross section III-III', and FIG. 18 is a cross sectional view showing a structure of the low withstand voltage MOS transistor along a cross section IV-IV' in FIG. 16. As shown in FIG. 16, a gate electrode 17 is formed so as to traverse an active region 18, and a device isolation region 19 is formed so as to surround the active region 18. The thermal oxide film 13 and the buried oxide film 14 described above are formed in the device isolation region 19.

As shown in FIG. 18 along a cross section IV-IV', the low withstand voltage MOS transistor fabricated by the manufacturing method of this embodiment has the same structure as a usual MOS transistor adopting trench isolation. In the active region 18, lightly-doped drains (LDD) 24 are formed, and source-drain regions 25 are formed. A thin gate oxide film 16 is formed so as to cover a channel region (portion in the surface of the silicon substrate I between the LDDs 24), and the gate electrode 17 is formed over the gate oxide film.

On the other hand, as shown in FIG. 17, since the depth of the tapered portion 8a of the trench 12 is shallow in the cross section III-III' even when the sub-channel is formed in the tapered portion 8a, the width thereof can be narrowed and the effect of the sub-channel can be decreased. This can suppress the generation of the hump characteristic.

As has been described above, according to the manufacturing method of the semiconductor device of this embodiment, it is possible to manufacture a semiconductor device in which the depth of the tapered portion 5a near the upper end of the trench 11 is relatively deep in the high withstand voltage region, whereas the depth of the tapered portion 8a near the upper end of the trench 12 is relatively shallow. This can sufficiently ensure the gate withstand voltage of a high withstand voltage MOS transistor and, at the same time, a low withstand voltage MOS transistor in which the generation of the hump characteristic is suppressed can be attained.

Second Embodiment

FIG. 19A to FIG. 19C, and FIG. 20A to FIG. 20B are cross sectional views showing a method of manufacturing a semiconductor device according to a second embodiment of the invention. Also in the second embodiment, a semiconductor device is manufactured, in the same manner as in the first embodiment, in which the depth of the tapered portion near the upper end of the trench is relatively deep in the high withstand voltage region, whereas the depth of the tapered portion near the upper end of the trench is relatively shallow in the low withstand voltage region. However, in the second embodiment, the step of forming the trench is different from that of the first embodiment. The method of manufacturing the semiconductor device according to the second embodiment is to be described specifically.

Figure 19A:
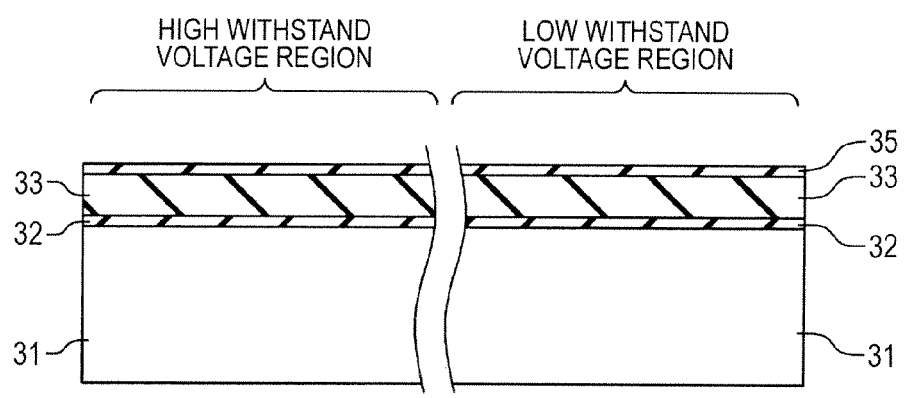
FIG. 19A is a cross sectional view showing a method of manufacturing a semiconductor device according to a second embodiment of the invention.

With reference to FIG. 19A, a thermal oxide film 32 of about 10 nm thickness is formed at first to the surface of a single crystal silicon substrate 31 by thermal oxidation at about 850° C. and then a silicon nitride film 33 with a thickness of about 160 nm is formed over the thermal oxide film 2 by a CVD method. An oxide film 35 of 40 nm thickness is formed thereover by a CVD method.

Figure 19B:
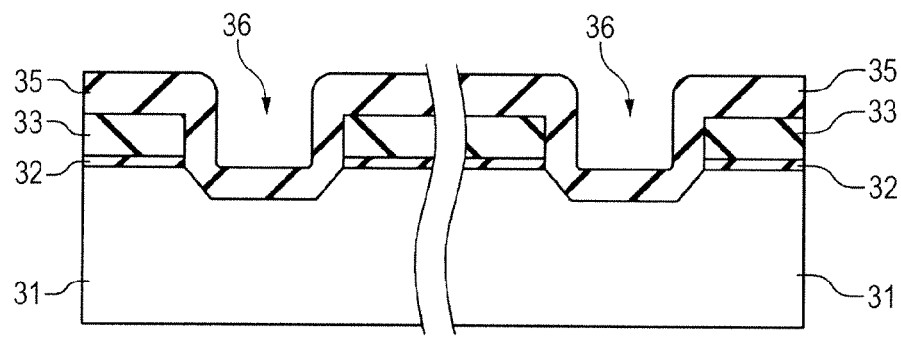
FIG. 19B is the cross sectional view showing the method of manufacturing the semiconductor device according to the second embodiment of the invention.

Then, as shown in FIG. 19B, the oxide film 35, the silicon nitride film 33, and the thermal oxide film 32 are removed at predetermined portions by dry etching using a photoresist as a mask to form openings where a portion of the silicon substrate 31 is exposed. Further, when the portions of the silicon substrate 31 exposed by the openings is dry etched shallowly, shallow trenches 36 are formed each at a depth of 40 nm. The shallow trench 36 is formed such that the taper angle (angle formed between the surface of the silicon substrate and the horizontal surface) of the side wall is preferably 45°. As to be described later, the side wall of the shallow trench 36 forms a tapered portion formed near the upper end of the trench in the high withstand voltage region, and forms a portion of the tapered portion in the low withstand voltage region. The side wall of the shallow trench 36 is hereinafter described as a tapered portion 36a. Further, after removing the photoresist, an oxide film 35 is grown over the entire surface at 70 nm thickness by a CVD method.

Figure 19C:
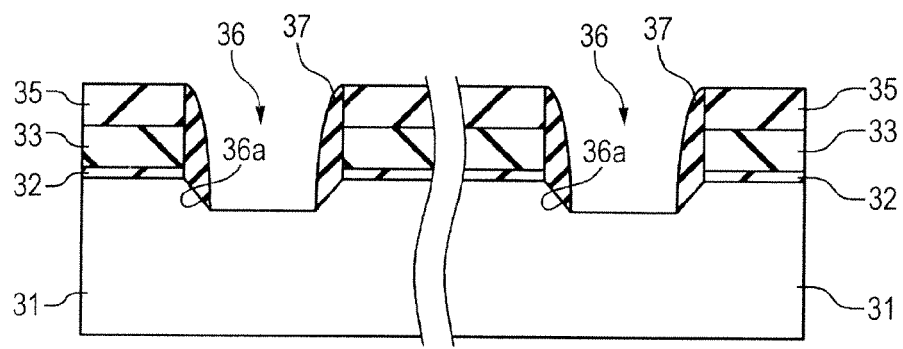
FIG. 19C is the cross sectional view showing the method of manufacturing the semiconductor device according to the second embodiment of the invention.

Then, as shown in FIG. 19C, the oxide film 35 is etched back by dry etching till the silicon substrate 31 is exposed at the bottom 36b of the shallow trench 36. Thus, a side wall 37 is formed.

Figure 20A:
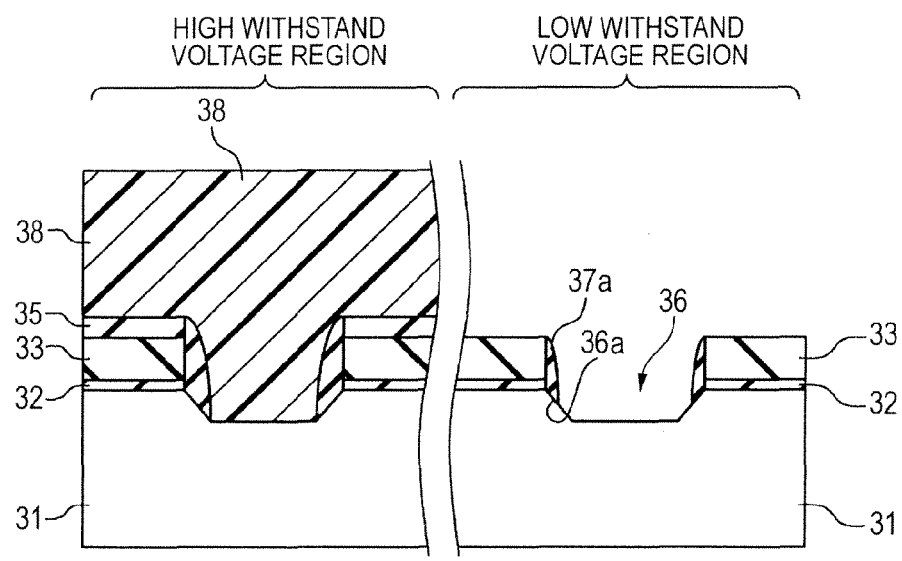
FIG. 20A is the cross sectional view showing the method of manufacturing the semiconductor device according to the second embodiment of the invention.

Then, as shown in FIG. 20A, etching back is performed additionally to the low withstand voltage region under the condition that the oxide film is etched in a state where only the high withstand voltage region is covered by a resist film 38. The etching back is performed such that the oxide film 35 over the silicon nitride film 33 is removed. By the etching back, the width of the side wall 37 is decreased only in the low withstand voltage region and a portion of the tapered portion 36a is exposed in the low withstand voltage region. The side wall decreased in the width in the low withstand voltage region is shown by reference 37a in FIG. 20A.

Figure 20B:
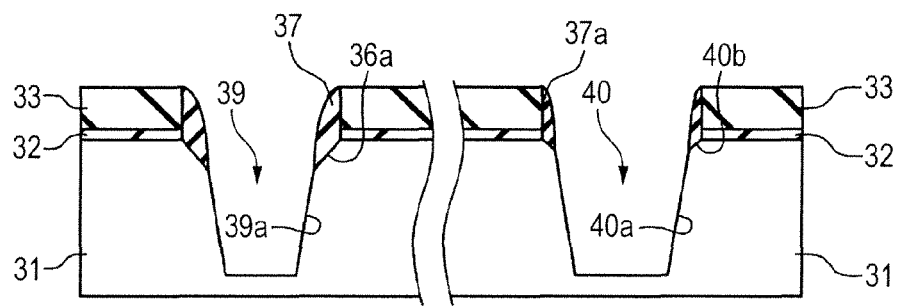
FIG. 20B is the cross sectional view showing the method of manufacturing the semiconductor device according to the second embodiment of the invention.

Successively, after removing the resist film 38, anisotropic etching is performed to form a trench 39 in the high withstand voltage region and a trench 40 in the low withstand voltage region as shown in FIG. 20B. The respective taper angles of the main portion 39a of the trench 39 and the main portion 40a of the trench 40 are steeper than the angle of the tapered portion 36a (that is, an angle formed relative to the surface of the silicon substrate 1 is larger). In the low withstand voltage region, the silicon substrate 31 is etched in a portion where the tapered portion 36a is exposed to form a tapered portion 40b joined to the main portion 40a. The depth of the main portion 39a of the trench 39 and the main portion 40a of the trench 40 is, for example, 800 nm. As described above, the trench 39 is formed in the high withstand voltage region such that the depth of the tapered portion 36a near the upper end of the trench 39 is relatively deep, whereas the trench 40 is formed in the low withstand voltage region such that the depth of the tapered portion 40b near the upper end of the trench 40 is relatively shallow.

After forming the trenches 39 and 40 by the steps as described above, the oxide film 35 over the silicon nitride film 33 and the side wall 37 (37a) are removed by wet etching. Then, formation of a thermal oxide film to the inner walls of the trenches 39 and 40, formation of a buried oxide film, additional etching to the buried oxide film, formation of a thick gate oxide film in the high withstand voltage region, formation of a thin gate oxide film in the low withstand voltage region, and formation of a gate electrode are performed by the steps identical with those in the first embodiment. Further, by way of steps for forming the MOS transistor such as ion implantation to source/drain regions, etc., a high withstand voltage MOS transistor and a low withstand voltage MOS transistor are formed respectively in the high withstand voltage region and the low withstand voltage region. The thus formed structure of the high withstand voltage MOS transistor and the low withstand voltage MOS transistor is identical with that of the first embodiment.

Also in the manufacturing method of the semiconductor device according to the second embodiment, it is possible to manufacture a semiconductor device in which the depth of the tapered portion 36a near the upper end of the trench 39 is relatively deep in the high withstand voltage region, and the depth of the tapered portion 40b near the upper end of the trench 40 is relatively shallow in the low withstand voltage region. Thus, it is possible, on one hand, to sufficiently ensure the gate withstand voltage of the high withstand voltage MOS transistor and, on the other hand, to obtain a low withstand voltage MOS transistor in which generation of the hump characteristic is suppressed.

Further, in the manufacturing method of the semiconductor device according to the second embodiment, since the shallow trenches 36 are formed simultaneously in both of the high withstand voltage region and the low withstand voltage region, this provides an advantage capable of decreasing the number of steps compared with that of the first embodiment.

The high withstand voltage MOS transistor and the low withstand voltage MOS transistor manufactured by the manufacturing method of the embodiments described above can be applied to various products. In one embodiment, the manufacturing method of the semiconductor device according to the embodiments described above is applied to the manufacture of the LCD driver.

Figure 21:
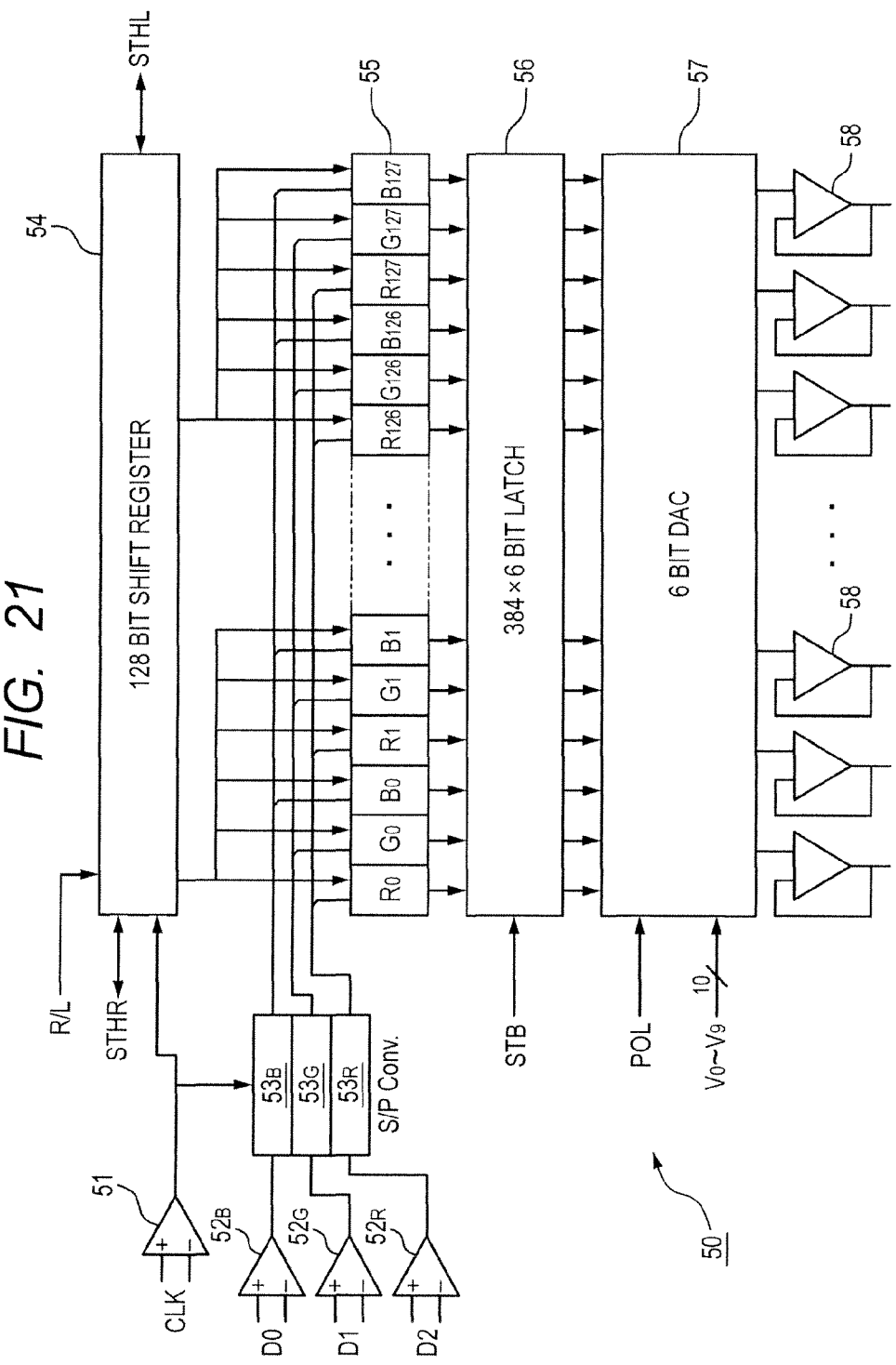
FIG. 21 is a block diagram showing an example of a configuration of a liquid crystal display driver which is applied with a high withstand voltage MOS transistor and a low withstand voltage MOS transistor formed by the method of manufacturing the semiconductor device according to the invention.

FIG. 21 shows an example of a configuration of such an LCD driver 50. The LCD driver 50 in FIG. 21 is adapted to drive a color LCD panel and has a clock input buffer 51, image signal input buffers $52_R$, $52_G$, and $52_B$, serial-parallel converters 53R, 53G, and 53B, a shift resistor 54, a flip-flop circuit 55, a latch circuit 56, a DA converter 57, and a power amplifier 58.

Each of the clock input buffer 51 and the image signal input buffers $52_R$, $52_G$, and $52_B$, is an input buffer circuit adapted to receive small amplitude differential signals. The clock input buffer 51 receives a differential clock signal CLK to generate a single-ended internal clock signal and supplies the generated internal clock signal to the serial-parallel converters $52_R$, $52_G$, and $52_B$, and to the shift resistor 54. The image signal input buffer $52_R$ receives a differential input signal D2 and generates a corresponding R image signal. The R image signal is a signal of transmitting data showing the gradation of red pixels of an LCD panel driven by the LCD driver 50. In the same manner, the image signal input buffer $52_G$ receives a differential input signal D1 and generates a corresponding G image signal, and the image signal input buffer $52_B$ receives a differential input signal D0 and generates a corresponding B image signal. The G image signal is a data showing the gradation of green pixels of the LCD panel and the B image signal is a data showing the gradation of blue pixels of the LCD panel. Each of the R image signal, the G image signal, and the B image signal is a serial data signal.

The serial-parallel converters $53_R$, $53_G$, and $53_B$, receive the R image signal, the G image signal, and the B image signal from the image signal input buffers $52_R$, $52_G$, and $52_B$, and perform serial-parallel conversion to the received R image signal, G image signal, and B image signal thereby generating R image data, G image data, and G image data. In the example of FIG. 21, each of the R image data, the G image data, and the B image data is a data showing the gradation of one pixel by six bits.

The shift resistor 54 is used for generating a latch signal so that each of the flip-flops contained in the flip-flop circuit 55 indicates the timing for receiving the R image data, the G image data or the B image data. The shift resistor 54 performs shift operation in response to a shift start pulse received from a shift start input/output STHR or STHL, and the internal clock signal received from the clock input buffer 51. The direction of the shifting operation of the shift resistor 54 is switched by a shift switching signal R/L.

The flip-flop circuit 55 receives the R image data, the G image data, and the B image data from the serial-parallel converters $53_R$, $53_G$, and $53_B$ and temporarily stores them. In this embodiment, the flip-flop circuit 55 comprises flip-flops by the number of 128 each having 6-bit memory capacity. Each of the flip-flops in the flip-flop circuit 55 stores an image data indicative of the gradation of the corresponding pixel.

The latch circuit 56 latches the image data from the flip-flop circuit 55 in response to a strobe signal STB and transfers the data to the DA converter 57. The DA converter 57 generates a gradation voltage corresponding to the image data received from the latch circuit 56. Specifically, the DA converter 57 receives gradation reference voltages V0 to V9, and generates a gradation voltage corresponding to each of the gradations that can be taken in each of the pixel [64 (=$2^6$)

gradations in the example of FIG. 21]. The DA converter 57 further selects a gradation voltage corresponding to the image data from the generated gradation voltage and outputs the selected gradation voltage to the power amplifier 58. The polarity of the outputted gradation voltage (defined based on the potential of a counter electrode of the LCD panel as a reference) is designated by a polarity signal POL.

The power amplifier 58 is configured as a voltage follower and outputs a driving voltage corresponding to the gradation voltage received from the DA converter 57 to a data line of the LCD panel (also referred to as source line, signal line, etc.) to drive each of the pixels of the LCD panel.

In one embodiment, the clock input buffer 51, the image signal input buffers $52_R$, $52_G$, and $54_B$ comprise low withstand voltage MOS transistors, and the power amplifiers 58 comprise high withstand voltage MOS transistors. The clock input buffer 51, the image signal input buffers $52_R$, $52_G$, and $52_B$ to which small amplitude differential signals are inputted preferably comprise the low withstand voltage MOS transistors suitable to the processing of small amplitude differential signals. On the other hand, the power amplifiers 58 which are required to output a high driving voltage preferably comprise high withstand voltage MOS transistors.

While the preferred embodiments of the invention have been described specifically, it should not be construed that the invention is restricted to the embodiments described above. The present invention can be practiced with various modifications which are obvious to persons skilled in the art.

What is claimed is:

1. A semiconductor device comprising:
   a silicon substrate;
   a first trench formed in a first region of the silicon substrate;
   a first buried oxide film for burying the first trench;
   a second trench formed in a second region of the silicon substrate;
   a second buried oxide film for burying the second trench;
   a first gate oxide film situated adjacent to the first trench and formed to the surface of the silicon substrate in the first region;
   a second gate oxide film situated adjacent to the second trench and formed to the surface of the silicon substrate in the second region;
   a first gate electrode formed over the first gate oxide film; and
   a second gate electrode formed over the second gate oxide film,
   wherein the thickness of the second gate oxide film is less than the thickness of the first gate oxide film,
   wherein the first trench includes:
   a first tapered portion extended from the surface of the silicon substrate and having a taper; and
   a first trench main portion extended from the bottom of the first tapered portion and having a taper steeper than the first tapered portion,
   wherein the second trench includes:
   a second tapered portion extended from the surface of the silicon substrate and having a taper;
   a second trench main portion extended from the bottom of the second tapered portion and having a taper steeper than the second tapered portion,
   wherein a second depth from an upper end of the second trench to a position where the second tapered portion and the second trench main portion are in contact with each other is shallower than a first depth from an upper end of the first trench to a position where the first tapered portion and the first trench main portion are in contact to each other.

2. A semiconductor device according to claim 1,
   wherein a divot is formed at the corner of the first burying oxide film, and
   wherein the distance between a position where the first tapered portion and the first trench main portion are in contact to each other and the divot is larger than the thickness of the first oxide film.

3. A semiconductor device according to claim 1, wherein the first gate oxide film has a thickness range from 30 to 50 nm.

4. A semiconductor device according to claim 1, wherein the first depth is in a range from 45 to 65 nm.

5. A semiconductor device according to claim 1, wherein the first tapered portion has a taper angle of about 45°.

6. A semiconductor device according to claim 1, wherein the first tapered portion and the second tapered portion have a flat surface.

* * * * *